(12) United States Patent
Chen et al.

(10) Patent No.: US 11,231,797 B2
(45) Date of Patent: Jan. 25, 2022

(54) TOUCH DISPLAY DEVICE AND TOUCH DISPLAY MODULE

(71) Applicant: Opto Plus LED Corp., New Taipei (TW)

(72) Inventors: Chien-Wen Chen, New Taipei (TW); Chen-Chen Ou Yang, New Taipei (TW); Kai-Chieh Yang, New Taipei (TW)

(73) Assignee: Opto Plus LED Corp., New Taipei (TW)

( * ) Notice: Subject to any disclaimer, the term of this patent is extended or adjusted under 35 U.S.C. 154(b) by 170 days.

(21) Appl. No.: 16/841,696

(22) Filed: Apr. 7, 2020

(65) Prior Publication Data

US 2020/0333908 A1 Oct. 22, 2020

(30) Foreign Application Priority Data

Apr. 19, 2019 (TW) .................................. 108113878

(51) Int. Cl.
*G06F 3/041* (2006.01)
*H05K 3/34* (2006.01)
*G06F 3/044* (2006.01)

(52) U.S. Cl.
CPC ............ *G06F 3/0412* (2013.01); *G06F 3/044* (2013.01); *H05K 3/341* (2013.01);
(Continued)

(58) Field of Classification Search
CPC ...... G06F 3/0412; G06F 3/044; G09F 9/3023; G09F 9/33; G09F 27/005; H05K 3/341;
(Continued)

(56) References Cited

U.S. PATENT DOCUMENTS 6,403,904 B1 * 6/2002 Schilling .................. H05B 3/74
200/310
9,746,168 B1 8/2017 Wu
(Continued)

FOREIGN PATENT DOCUMENTS

TW 614302 U 12/2002
TW I419136 B 12/2013
(Continued)

*Primary Examiner* — Jimmy H Nguyen
(74) *Attorney, Agent, or Firm* — CKC & Partners Co., LLC (57) ABSTRACT

A touch display device includes a printed circuit board and a cover. The printed circuit board has a top surface, a bottom surface and soldering points. The printed circuit board includes a first printed circuit, a light element and a second printed circuit. A part of the first printed circuit is on the top surface or the bottom surface and connected with the corresponding soldering point. The light emitting element is on the top surface and electrically connected to the first printed circuit. On the top surface, the second printed circuit does not overlap with the first printed circuit. The cover covers the printed circuit board. The cover has light transmission areas which are aligned with the light elements. The second printed circuit is configured to provide a capacitance value coupled to a capacitive sensing element coupled between the second printed circuit and the cover.

14 Claims, 5 Drawing Sheets

(52) U.S. Cl.
CPC .............. *H05K 2201/10106* (2013.01); *H05K 2201/10128* (2013.01); *H05K 2201/10318* (2013.01)

(58) Field of Classification Search
CPC ................. H05K 3/3405; H05K 1/117; H05K 2201/09181; H05K 2201/10303; H05K 2201/10318; H05K 2201/10106; H05K 2201/09354; H05K 2201/10189; H05K 2201/10128; H03K 17/962; H03K 2017/9602; H03K 2217/96031; H03K 2217/960755
USPC ...................................... 345/173, 34, 82, 174
See application file for complete search history.

(56) References Cited

U.S. PATENT DOCUMENTS

2006/0290374 A1\* 12/2006 Fisher ...................... G09F 9/33
                                                                                      257/84
2009/0090605 A1\* 4/2009 Arione ................. H03K 17/962
                                                                                      200/314
2011/0019412 A1\* 1/2011 Wu ...................... G09F 9/3023
                                                                                      362/235

FOREIGN PATENT DOCUMENTS

| TW | I533605 B | 5/2016 |
| TW | 201624247 A | 7/2016 |
| TW | I570616 B | 2/2017 |

\* cited by examiner

TOUCH DISPLAY DEVICE AND TOUCH DISPLAY MODULE

RELATED APPLICATIONS

This application claims priority to Taiwan Application Serial Number 108113878, filed Apr. 19, 2019, which are herein incorporated by reference.

BACKGROUND

Field of Invention

The present disclosure relates to a display device with touch functions and to a touch display module, in which the display device includes a seven-segment display device.

Description of Related Art

Traditional display devices, such as seven-segment displays, are still widely used. For example, traditional display devices can be used for a clock or as a scoreboard typically found on a sports field. Such traditional display devices may also be found at teaching sites. Compared with devices that can display more complex images (for example, TV screens), traditional display devices such as seven-segment displays are cheaper and easier to set up.

With the advance of technology, display devices with touch functions are becoming increasingly popular. However, the touch functions for these display devices are achieved in combination with an additional touch element, which is not suitable for use with a traditional display device.

SUMMARY

One aspect of the present disclosure is related to a touch display device.

According to one embodiment of the present disclosure, a touch display device includes a printed circuit board and a cover. The printed circuit board has a top surface, a bottom surface and a plurality of soldering points. The printed circuit board includes a first printed circuit, a plurality of light emitting elements and a second printed circuit. A part of the first printed circuit is on at least one of the top surface and the bottom surface of the printed circuit board. The part of the first printed circuit is connected with the corresponding soldering point. The light emitting elements are located on the top surface of the printed circuit board and electrically connected to the first printed circuit. The second printed circuit does not overlap with the first printed circuit on the top surface. The cover covers the printed circuit board. The cover has light transmission areas respectively aligned with the light emitting elements.

In some embodiments of the present disclosure, the touch display device further includes a capacitive sensing element. The capacitive sensing element is electrically connected to the second printed circuit to detect the changing capacitance value of the cover. The second printed circuit is configured to provide a capacitance value coupled to a capacitive sensing element coupled between the second printed circuit and the cover.

In some embodiments of the present disclosure, the second printed circuit is electrically connected a corresponding one of the soldering points.

In some embodiments of the present disclosure, the cover contacts the first printed circuit.

In some embodiments of the present disclosure, the cover contacts the second printed circuit.

In some embodiments of the present disclosure, the cover contacts the first printed circuit and the second printed circuit.

In some embodiments of the present disclosure, the light emitting elements are light emitting diodes.

In some embodiments of the present disclosure, the cover has a plurality of accommodating sections. The light emitting elements are respectively located in the accommodating sections.

In some embodiments of the present disclosure, the touch display device further includes a plurality of pins. The pins respectively protrude the printed circuit board from the corresponding soldering points.

In some embodiments of the present disclosure, the printed circuit board has at least one fixing opening. The cover has at least one fixing member, and the at least one fixing member is coupled to the at least one fixing opening.

In some embodiments, the touch display device further includes an adhesive layer. The adhesive layer is configured at the bottom surface of the printed circuit board to connect the printed circuit board and the cover.

In some embodiments of the present disclosure, the printed circuit board further has at least one light sensor. The light sensor is located on the top surface of the printed circuit board. The light sensor is aligned with at least one of the light transmission areas.

In some embodiments of the present disclosure, the light transmission areas comprise seven first light transmission areas to form a seven-segment display.

In some embodiments, the printed circuit board further has a light sensor. The light transmission areas of the cover further includes a second light transmission area. The second light transmission area is located at a side of the seven light transmission areas and aligned with the light sensor.

One aspect of the present disclosure is related to a touch display module.

According to one embodiment of the present disclosure, the touch display module includes a plurality of the touch display devices mentioned above. The touch display devices are coupled to each other.

In summary, in the above embodiments of the present disclosure, touch functions of the touch display device are achieved by the second printed circuit integrated on the cover, and the second printed circuit can be directly printed on the printed circuit board. Compared with integrating additional touch elements with display devices to generate touch functions, the manufacturing of the first printed circuit and the second printed circuit in the production process is more cost-effective, and space is also reduced. In addition, a plurality of the touch display devices can be combined as a touch display module, so that more complex touch functions can be realized in a simple manner.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the disclosure.

DETAILED DESCRIPTION

The following embodiments are disclosed with accompanying diagrams for a detailed description. For illustration clarity, many details are explained in the following descriptions. However, it should be understood that these details do not limit the present invention. That is, these details are not necessary in parts of embodiments of the present invention. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

In addition, terms used in the specification and the claims generally have the usual meaning as used in the field, in the context of the disclosure and in the context of the particular content unless particularly specified. Some terms used to describe the disclosure are discussed below or elsewhere in the specification to provide additional guidance related to the description of the disclosure to those in the art.

Phrases "first," "second," etc., are solely used to separate the descriptions of elements or operations with the same technical terms, and are not intended to convey a meaning of order or to limit the disclosure.

Secondly, phrases "comprising," "includes," "provided," and the like, are all open-ended terms, i.e., meaning including but not limited to.

Figure 1:
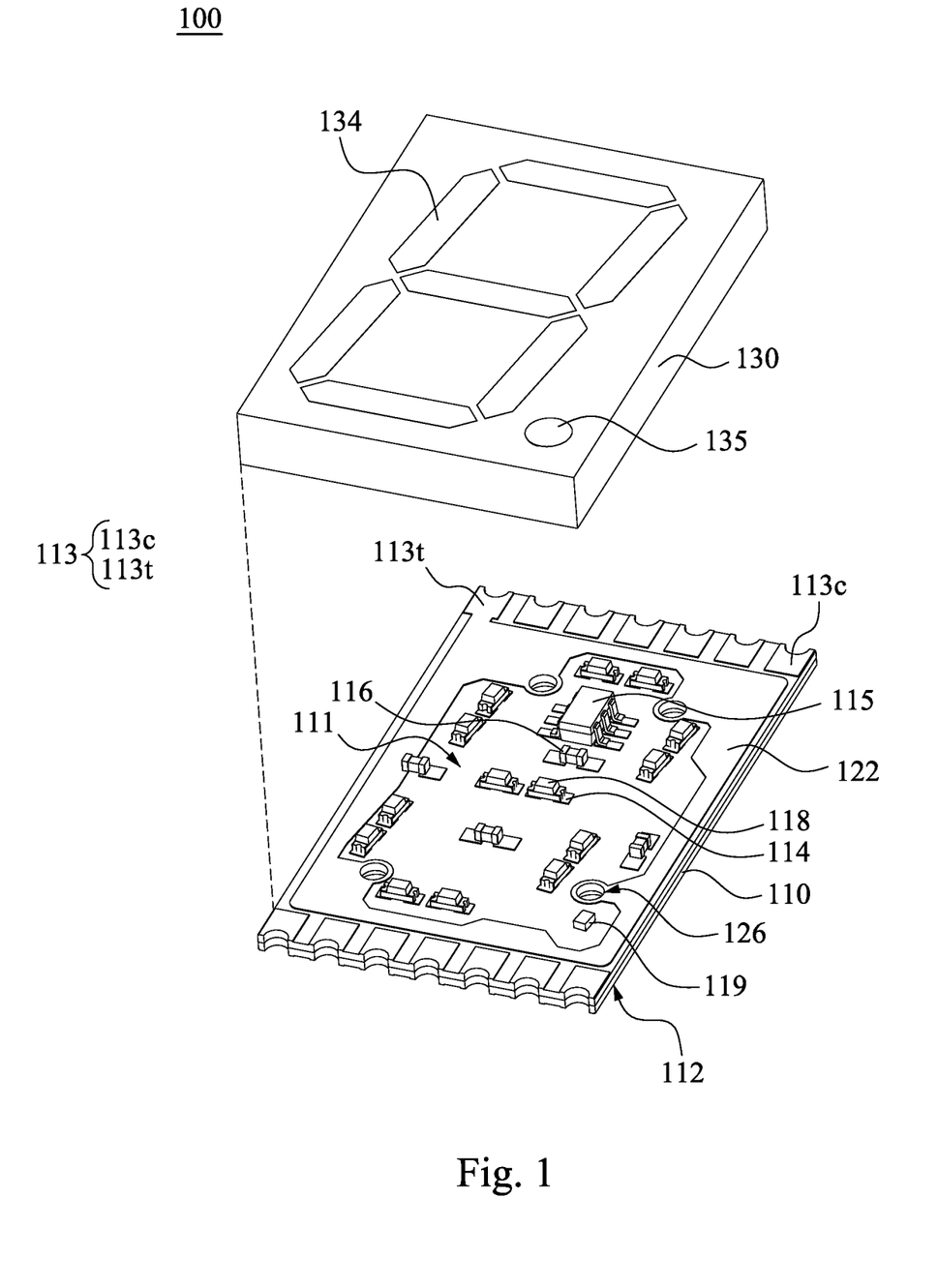
FIG. 1 is an exploded view of a touch display device according to an embodiment of the disclosure.

FIG. 1 is an exploded view of a touch display device 100 according to an embodiment of the disclosure. In this embodiment, the touch display device 100 includes a printed circuit board 110, a cover 130 and a capacitive sensing device 115.

In this embodiment, the capacitive sensing device 115 is a touch IC integrated on the printed circuit board 110. However, it should be understood that the touch display device 100 with the integrated capacitive sensing device 115 is an example and does not limit the present disclosure. In some embodiments, the capacitive sensing device 115 does not need to be integrated on the printed circuit board 110. Reference may be made to the description below.

Referring to FIG. 1, the printed circuit board 110 has a top surface 111, an opposite bottom surface 112 and a plurality of soldering points 113. The soldering points 113 include soldering points 113c and 113t as shown in FIG. 1. The printed circuit board 110 includes a first printed circuit 114, a plurality of light emitting elements 118 and a second printed circuit 122. The soldering points 113t are connected to the second printed circuit 122.

In this embodiment, the first printed circuit 114 is partially exposed on the top surface 111 and/or the bottom surface 112 of the printed circuit board 110, and the first printed circuit 114 is electrically connected the corresponding soldering points 113c of the soldering points 113. The exposed part of the first printed circuit 114 is used for connection to other elements (e.g., the light emitting elements 118) on the printed circuit board 110. In some embodiments, the printed circuit board 110 is a multi-layered splint structure, and the routing of the first printed circuit 114 can be configured inside the printed circuit board 110. By reducing the part of the first printed circuit 114 exposed on the printed circuit board 110, the usable area of the top surface 111 and the bottom surface 112 of the printed circuit board 110 can be increased for greater placement or integration of elements.

In this embodiment, the printed circuit board 110 further has a plurality of passive elements 116. Some of the passive elements 116 are electrically connected to the light emitting elements 118. When the light emitting elements 118 emit light, the passive elements 116 connected to the light emitting elements 118 can be used to protect the first printed circuit 114 and the light emitting elements 118. In some embodiments, the passive elements 116 include resistances.

In this embodiment, the capacitive sensing element 115 is integrated on the top surface 111 of the printed circuit board 110. The passive element 116 used for the capacitive sensing element 115 is also integrated on the top surface 111 of the printed circuit board 110. In other words, the capacitive sensing element 115 and the passive element 116 used for the capacitive sensing element 115 are electrically soldered to the exposed part of the first printed circuit 114, and the exposed part of the printed circuit 114 is exposed on the top surface 111. In this embodiment, a light sensor 119 is further integrated on the top surface 111 of the printed circuit board 110. The light sensor 119 is located near a side of one of the light emitting elements 118. In some embodiments, the first printed circuit 114 can be configured on the bottom surface 112 of the printed circuit board 110.

In this embodiment, the printed circuit board 110 has a plurality of the light emitting elements 118 on the top surface 111. In this embodiment, the light emitting elements 118 are light emitting diodes (LEDs). The light emitting elements 118 are arranged in a specific way to achieve display functions of the touch display device 100. In this embodiment, the display functions of the touch display device 100 are provided in the form of a seven-segment display. As shown in FIG. 1, on the printed circuit board 110, the light emitting elements 118 are arranged as a rectangle bisected by a horizontal segment. Therefore, numbers can be formed by the touch display device 100. It should be understood that the seven-segment display form arrangement is an example and does not limit the present disclosure. In this embodiment, the light emitting elements 118 are electrically connected to the first printed circuit 114, and the first printed circuit 114 is electrically connected to the corresponding soldering point 113c. In some embodiments, an external control circuit can be connected to the first printed circuit 114 through the corresponding soldering point 113c, and the external control circuit can control the light emitting elements 118 to achieve the display functions of the touch display device 110.

As illustrated in FIG. 1, in this embodiment, the second printed circuit 122 is located on the top surface 111 of the printed circuit board 110. However, on the top surface 111, the second printed circuit 122 does not overlap the first printed circuit 114. The second printed circuit 122 is electrically connected to a corresponding soldering point 113t of the soldering points 113. The second printed circuit 122 is configured to perform the touch functions of the touch display device 100. One of the advantages of the second printed circuit 122 being electrically connected to the soldering point 113t is that after the touch display device 100 is constructed, the second printed circuit 122 can be further tested through the soldering point 113t, and the sensitivity of the touch functions can even be adjusted. In some embodiments, the second printed circuit 122 can be printed on the printed circuit board 110 together with the first printed circuit 114 when the printed circuit board 110 is manufactured, so as to reduce production costs. In some embodiments, the second printed circuit 122 is a metal pad integrated on the top surface of the printed circuit board 110.

In some embodiments, the second printed circuit 122 is not necessarily connected to the soldering point 113$t$. For example, when the capacitive sensing element 115 is located on the printed circuit board 110, the second printed circuit 122 can be electrically connected to the capacitive sensing element 115 directly, and does not need to be additionally connected to the soldering point 113$t$.

The printed circuit 110 is covered by the cover 130 of the touch display device 100. The cover 130 is coupled to the second printed circuit 122. The cover 130 has a plurality of first light transmission areas 134, and each light emitting element 118 is aligned with one of the first light transmission areas 134. In some embodiments, one first light transmission area 134 can be aligned with one or more light emitting elements 118. In this embodiment, each first light transmission area 134 is aligned with two corresponding light emitting elements 118 on the top surface 111 of the printed circuit board 110. In this embodiment, the material of the first light transmission areas 134 is a diffusion agent. In this embodiment, the light emitting elements 118 are arranged in the form of a seven-segment display, and the cover 130 includes seven first light transmission areas 134 to form a seven-segment display. The seven first light transmission areas 134 are seven segments arranged as a rectangle of two vertical segments on each side with one horizontal segment on the top, middle, and bottom, and the middle segment between the two side of the rectangle bisects the rectangle horizontally. Each of the seven first light transmission area 134 is aligned with two corresponding light emitting elements 118 first light transmission areas 134. Therefore, the image of numbers can be formed by the touch display device 100. For example, when all of the seven light emitting elements 118 aligned with the seven light transmission areas 134 emit light, a number "8" is formed on the upper cover 130. In this embodiment, the cover 130 further includes a second light transmission area 135. The second light transmission area 135 is aligned with the light sensor 119, and the second light transmission area 135 is at a side of a corresponding one of the seven first light transmission areas 134. Therefore, the light sensor 119 and the second light transmission area 135 enable the touch display device 100 to have a function of receiving a light signal. It should be understood that the alignment described herein is not limited to vertical alignment. For example, in some embodiments, the light emitting elements 118 are not necessarily aligned vertically with the first light transmission areas 134, and each light emitting element 118 corresponds to a first light transmitting area 134, with the light emitted by the light emitting element 118 passing through the corresponding first light transmitting area 134, which is made by a diffusion agent. In such a case, the number "8" can still be formed on the upper cover 130.

Figure 2:
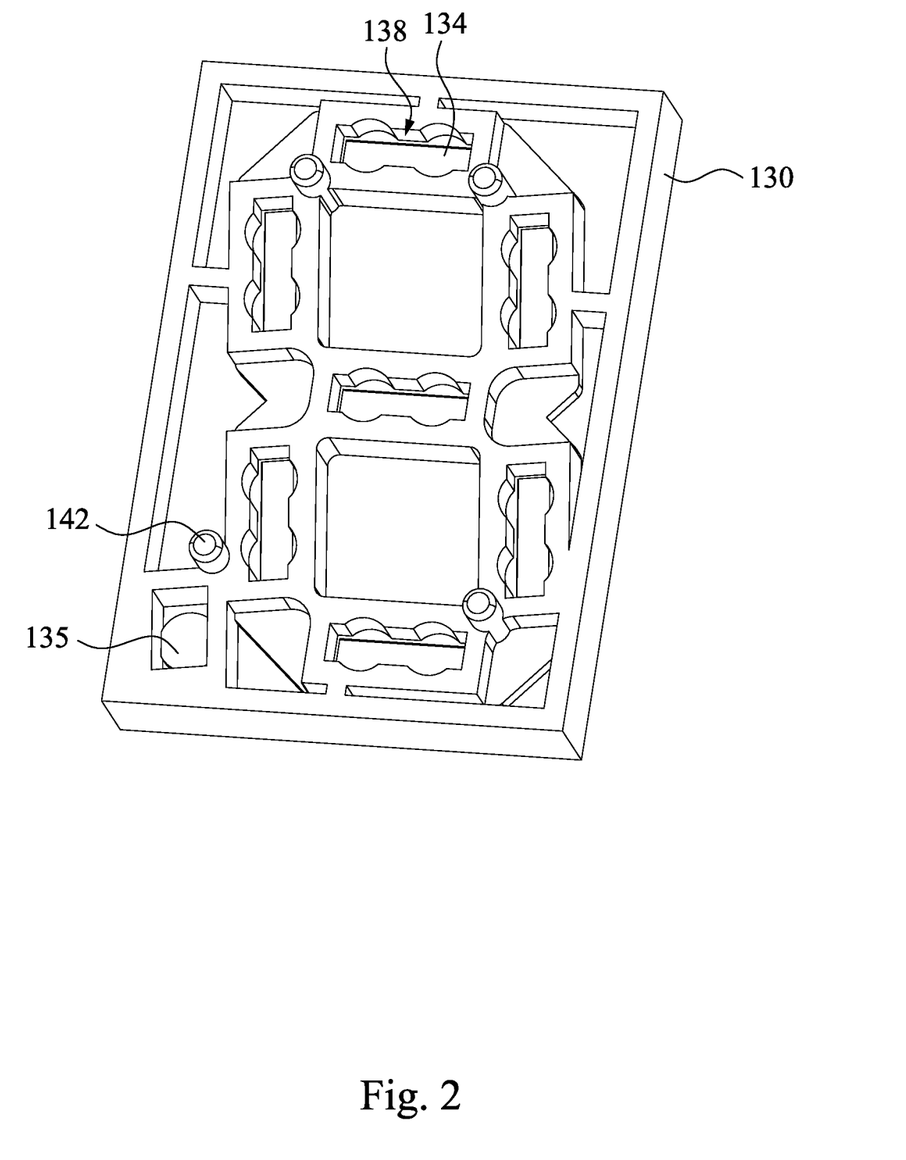
FIG. 2 illustrates the bottom surface of a cover of the touch display device of FIG. 1.

FIG. 2 illustrates the bottom surface of the cover 130 of the touch display device 110 of FIG. 1. As shown in FIG. 2, in this embodiment, the cover 130 further has a plurality of accommodating sections 138. The bottom of each accommodating section 138 has a corresponding first light transmission area 134 or second light transmission area 135. In this embodiment, when the cover 130 is connected to the printed circuit board 110, each first light transmission area 134 and the corresponding accommodating section 138 are aligned with the corresponding one of the light emitting elements 118, and the light emitting elements 118 are respectively located in the corresponding accommodating sections 138. In this embodiment, the accommodating sections 138 can be regarded as segment inside space with segment shapes. Therefore, when the light emitting elements 118 emit light, the emitted light from each light emitting element 118 will not leak from the corresponding accommodating section 138. In other words, the light emitted from any one of the light emitting elements 118 does not affect the light emitted from the other light emitting elements 118.

Referring to both FIG. 1 and FIG. 2, in some embodiments, the printed circuit board 110 further has at least one fixing opening 126, and the cover 130 further has at least one fixing member 142. In this embodiment, the touch display device 100 has four fixing openings 126 on the printed circuit board 110 and four fixing members 142 on the bottom of the cover 130. As shown in FIG. 1 and FIG. 2, in this embodiment, each fixing member 142 can be regarded as a boss, and the four fixing openings are four boss holes. When the printed circuit board 110 is connected to the cover 130, the fixing members 142 are respectively aligned with the fixing openings 126, and the fixing members 142 protrude from the bottom surface 112 of the printed circuit board 110 to interconnect the printed circuit board 110 and the cover 130.

In some embodiments, the touch display device 100 further includes an adhesive layer. After fixing the printed circuit board 110 and the cover 130 through the fixing members 142 and the fixing openings 126, the adhesive layer can be disposed at the bottom surface 112 of the printed circuit board 110, such that the bottom surface 112 is connected to the cover 130. In that case, the fixing members 142 can be regarded as a cold stakes. An advantage of such a configuration is that the bottom surface 112 of the printed circuit board 110 does not need to be fixed by a hot press assembly process, and the bottom surface 112 of the printed circuit board 110 can have a larger number of elements and circuits.

In this embodiment, the touch functions of the touch display device 110 are achieved by contact between the cover 130 and the second printed circuit 122. In this embodiment, a part of the second printed circuit 122 is located in one of the fixing openings 126, and the corresponding fixing member 142 is coupled to the fixing opening 126, such that the cover 130 is coupled to the second printed circuit 122 by direct contact between the cover 130 and the second printed circuit 122. The soldering point 113$t$ is connected to the second printed circuit 112. Through the soldering point 113$t$, the second printed circuit 122 can be measured to have a capacitance value. The capacitance value is caused by the coupling between the second printed circuit 122 and the cover 130. When a user's finger contacts the cover 130, the finger, the cover 130 and the second printed circuit 122 are coupled to each other, and another capacitance value can be provided by measuring the soldering point 133$t$. Since the finger is a conductor, after the finger touches the cover 130, the overall capacitance value measured by the soldering point 133$t$ will be affected. Therefore, the capacitance value measured before the finger touches and the capacitance value measured after the finger touches are different. By measuring the capacitance value by connecting the capacitive sensing element 115 to the soldering point 113$t$, a determination can be made as to whether the user has touched the panel 130, thereby realizing the touch function.

In some embodiments, the cover 130 does not need to contact the second printed circuit 122 directly. Even if the second printed circuit 122 does not contact the cover 130, the second printed circuit 122 is still coupled to the cover 130, and a capacitance value caused by the coupling of the cover 130 and the second printed circuit 122 can still be provided. When the user's finger touches the cover 130, the finger, the cover 130, and the second printed circuit 122 are coupled to each other since the finger is conductive, and the change in the capacitance value can be measured through the second printed circuit 122 to determine whether the user's finger has touched the cover 130 to realize the touch function. In such embodiments, it is necessary to ensure that the distance between the cover 130 and the second printed circuit 122 is not too large. In other words, the distance between the cover 130 and the second printed circuit 122 should be less than a predetermined value. This ensures that the cover 130 directly contacts a part of the printed circuit board 110 and is fixed. In some embodiments, the cover 130 contacts the first printed circuit 114. In some embodiments, the cover contacts the first printed circuit 114 and the second printed circuit 122.

In this embodiment, the cover 130 covers the top surface 111 of the printed circuit board 110, and the cover 130 contacts the second printed circuit 122 but not the first printed circuit 114, the capacitive sensing elements 115, the passive element 116, the light emitting elements 118 and the light sensor 119. Therefore, the cover 130 does not damage those elements.

As shown in FIG. 1, in this embodiment, the conductive sensing element 115 and the passive element 116 are integrated to the printed circuit board 110. Such a configuration can reduce the occupied area for circuit routing and prevent noise from affecting the touch functions and the display functions. In some embodiments, through the direct integration of the capacitive sensing element 115, the display function of the touch display device 100 can be directly switched on and off by touching the cover 130.

In the present disclosure, it should be understood that the capacitive sensing element 115 does not have to be integrated on the printed circuit board 110. That is, the second printed circuit 122 can be connected to an external capacitive sensing element 115 through the corresponding soldering point 113t to thereby realize the touch functions.

In the above embodiments, the touch display device 100 of the present disclosure is described with reference to FIGS. 1 and 2. The display functions of the touch display device 100 can be performed by a seven-segment display, and the touch function can be realized by the coupling between the second printed circuit 122, the cover 130 and the capacitive sensing element 115. In some embodiments, by the integration of the light sensor 119 on the printed circuit board 110, the touch display device 100 can realize the display functions, the touch functions and light sensing functions through use of a limited amount of space.

In addition to the above structure, in some embodiments, the printed circuit board 110 and the cover 130 can be configured with a light transmitting adhesive for protecting elements of the touch display device 100. The light-transmitting adhesive does not excessively affect the light emission of the light emitting elements 118, and further provides a waterproof function for the printed circuit board 110 and the cover 130. In addition to having a waterproof function, the waterproof adhesive is also a dielectric material, such that the variation range of the capacitance value measured through the second printed circuit 122 can be further increased to thereby in turn increase the sensitivity for the touch function.

Figure 3:
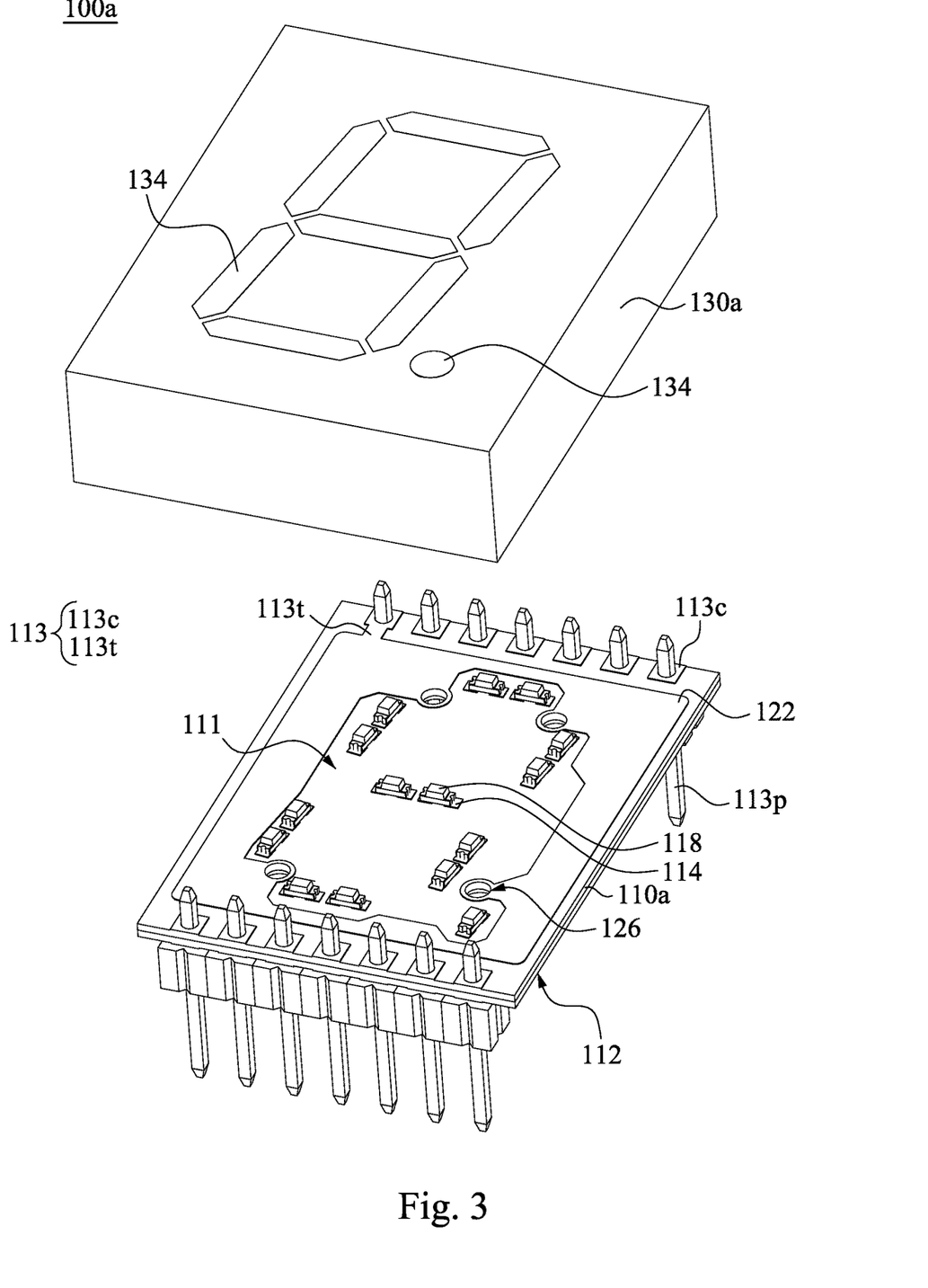
FIG. 3 is an exploded view of a touch display device according to another embodiment of the disclosure.

According to the above description, in some embodiments, a configuration may be provided in which there is no integration of the capacitive sensing element 115 with the printed circuit board 110 and the cover 130. FIG. 3 is an exploded view of a touch display device 100a according to another embodiment of the disclosure. Referring to FIG. 1 and FIG. 3, the difference between the printed circuit board 110a of the touch display device 100a and the printed circuit board 110 of the touch display device 100 lies in the different elements included in the printed circuit board 110a and the way in which the soldering points 113 are connected externally. As shown in FIG. 3, the printed circuit board 110a includes only the first printed circuit 114, the light emitting elements 118, and the second printed circuit 122. That is, in this embodiment, the capacitive sensing element of the touch display device 100a is not integrated on the printed circuit board 110a and the cover 130a. The capacitive sensing element can be connected to the second printed circuit 122 through the corresponding soldering point 113t. Therefore, the touch display device 100a can be made simpler as an independent touch module to be connected with other circuits having a capacitive sensing element. Since the printed circuit board 110a does not have a light sensor 119, the light emitting element 118 is placed in the position of the light sensor 119 in the previous embodiment. The touch display device 100a does not have the function of light sensing, but only the functions of touch sensing and signal displaying.

Continued reference is made to FIG. 1 and FIG. 3. In FIG. 1, the soldering points 113 are designed as half barrel solder pads. The soldering points 113 are distributed on the edge of the top surface 111 of the printed circuit board 110, and the metal contacts connected outwardly are exposed. The other printed circuit boards and the metal contacts of the printed circuit board 110 can be directly soldered. As shown in FIG. 3, in this embodiment, the touch display device 100a further includes a plurality of pins 113p, and the pins 113p protrude from the soldering points 113c and 113t perpendicularly from the bottom surface 112 and the top surface 111 of the printed circuit board 110a, and the soldering points 113c and 113t are respectively connected to the pins 113p.

Figure 4:
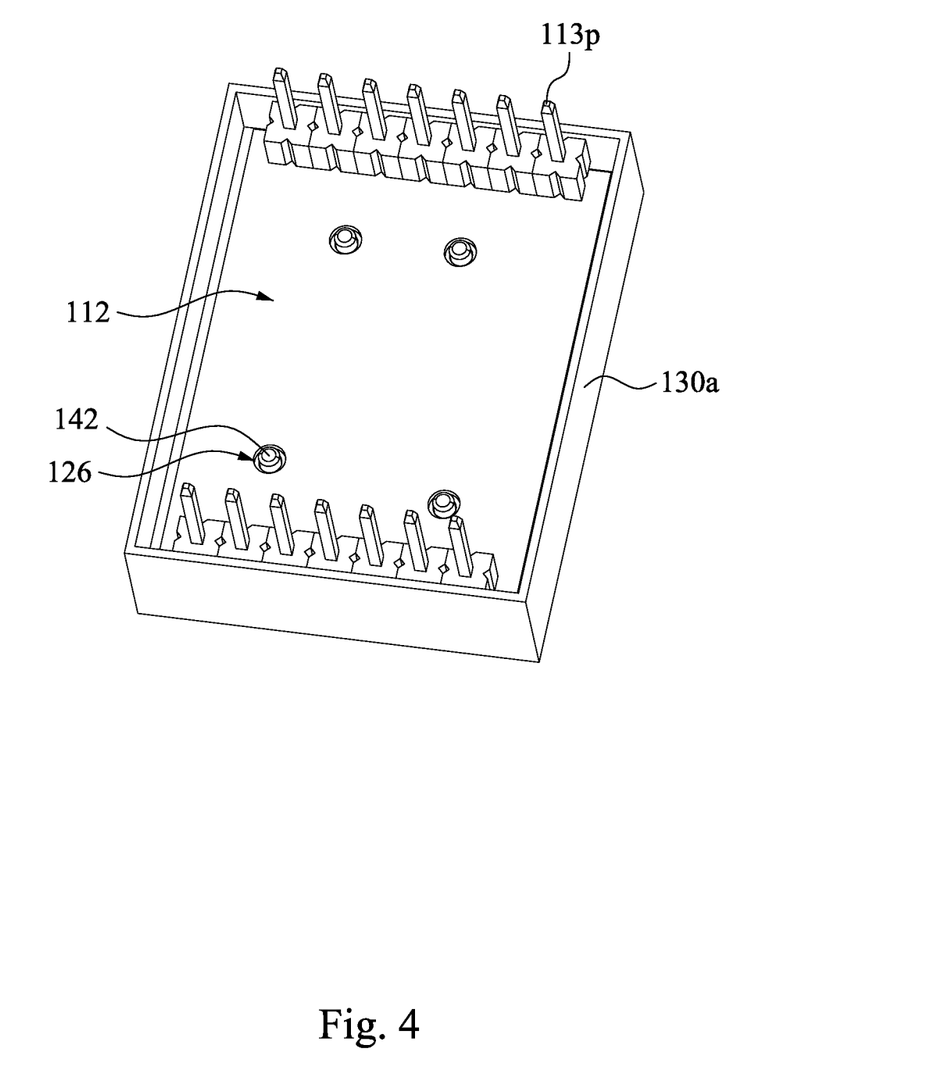
FIG. 4 illustrates the bottom surface of the touch display device of FIG. 3.

FIG. 4 illustrates the bottom surface of the touch display device 100a of FIG. 3. In this embodiment, after the cover 130a is connected to the printed circuit board 110a, the cover 130 completely covers the top surface 111 of the printed circuit board 110a, and the pins 113p of the printed circuit board 110a protrude from the bottom surface 112. The touch display device 100a having the pins 113p protruding from the printed circuit board 110a allows for more convenient soldering to a device having a corresponding opening for pins.

Figure 5:
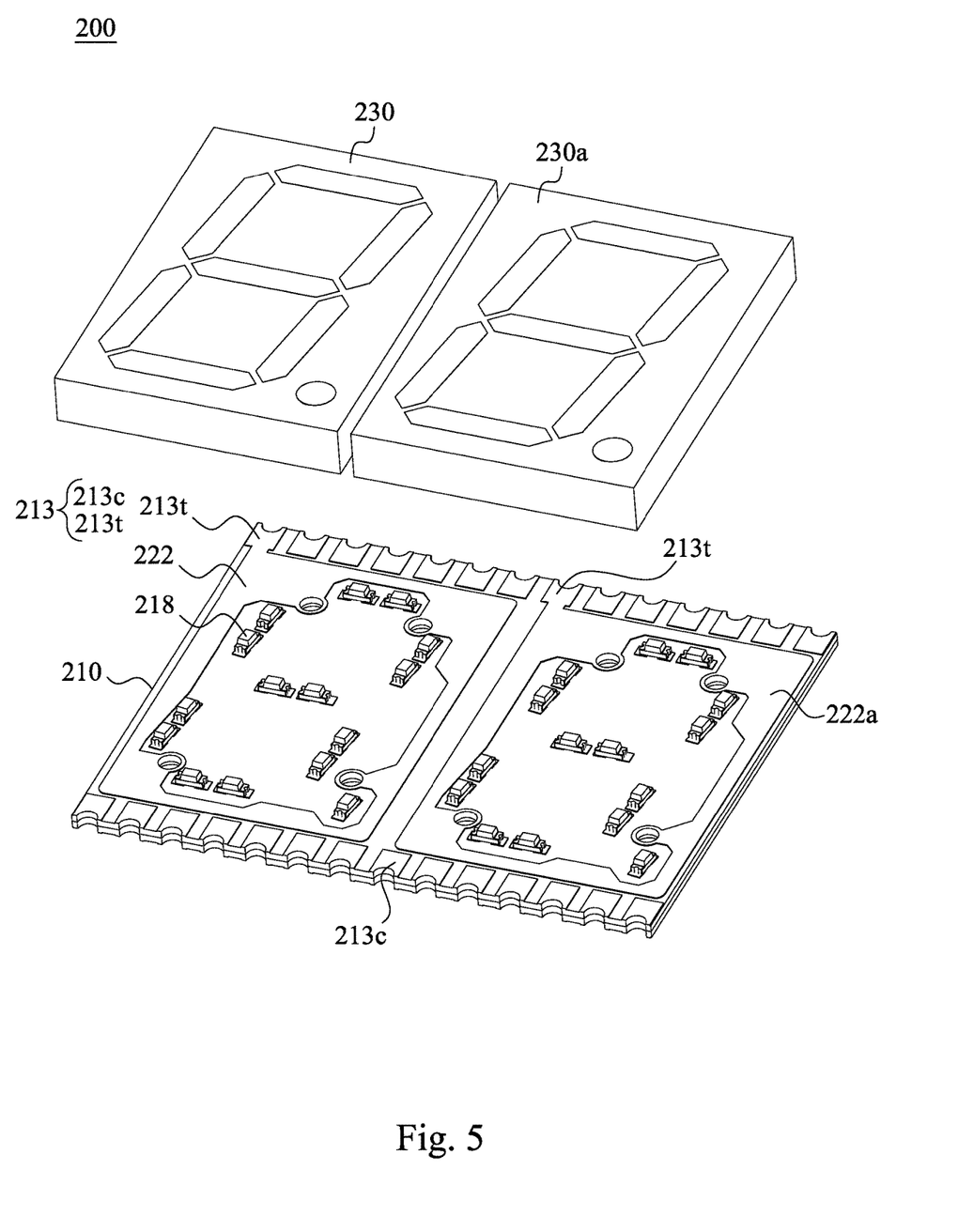
FIG. 5 is an exploded view of a touch display module according to an embodiment of the disclosure.

FIG. 5 is an exploded view of a touch display module 200 according to an embodiment of the disclosure. The touch display module 200 is constructed by integrating a plurality of touch display devices described above, and these touch display devices are coupled to each other. FIG. 5 illustrates an embodiment of the present disclosure. This embodiment integrates two exemplary touch display devices of the present disclosure. The two touch display devices share a printed circuit board 210.

As shown in FIG. 5, the touch display module 200 has one printed circuit board 210. The printed circuit board 210 is a combination of two blocks, and each block is a touch display device of the present disclosure (e.g., touch display device 100a shown in FIG. 3). Two second printed circuits 222 and 222a are respectively on the two blocks of the printed circuit board 210. The soldering points 213 on the printed circuit board 210 are half barrel solder pad structures and thereby easy to directly solder to other control circuits. The soldering points 213 include soldering points 213c and soldering points 213t, and the soldering points 213t are respectively connected to the second printed circuits 222 and 222a. In this embodiment, although the two touch display devices on the two blocks are located on the one printed circuit board 210, the second printed circuit 222 is coupled to the cover 230, the second printed circuit 222a is coupled to the cover 230a, and the covers 230 and 230a are independent. When the user's finger touches the cover 230, a change of a capacitance value can be measured by a corresponding soldering point 213t as described above. A similar operation can be performed with respect to the cover 230a. Thus, the covers 230 and 230a can have a capacitance value change due to such touch actions. The second printed circuits 222 and 222a can be respectively connected to external capacitive sensing elements through the corresponding soldering points 213t. The changes of the capacitance values from the different covers 230 and 230a are sensed and respectively converted into touch signals. The capacitive sensing element is, for example, the capacitive sensing element 115 shown in FIG. 1. Therefore, in this embodiment, touching different covers 230 and 230a of the touch display module 200 can generate different touch signals.

In some embodiments, the touch display module 200 is connected to an external circuit. The external circuit receives different touch signals from different covers 230 and 230a to control the light emission of the plurality of light emitting elements 218 of the touch display module 200. For example, the touch display module 200 is a controllable digital display module that controls the light emitting elements 218 to emit light, so that the touch display module 200 displays a set of numbers between "00" and "99." In this example, the number is increased by one when the cover 230 is touched once, and the number is decreased by one when the cover 230a is touched once. It should be understood that this is only one embodiment of the touch display module 200. Other similar examples, such as touching different covers 230 and 230a cause the numbers displayed by the touch display module 200 to change in brightness to be lighter and darker. The embodiments in which the display signals of the light emitting elements 218 are controlled by using different touch signals of different covers 230 and 230a are included in the present invention.

It should be understood that the touch display module 200 as an adjustable digital display module is merely an embodiment of the disclosure, and the disclosure should not be limited thereto. For example, the touch display device of the touch display module 200 disclosed herein does not necessarily share the same printed circuit board, or the touch display module 200 can further integrate a touch IC or a light sensor. In some embodiments, the touch display module 200 can integrate a larger number of touch display devices, and such configurations are all included in the present disclosure.

The foregoing has described features of several embodiments so that those skilled in the art may better understand the description in various aspects. It will be apparent to those skilled in the art that various modifications and variations can be made to the structure of the embodiments of the present disclosure without departing from the scope or spirit of the present disclosure. In view of the foregoing, it is intended that the present disclosure cover modifications and variations of this invention provided they fall within the scope of the following claims.

What is claimed is:

1. A touch display device, comprising:
   a printed circuit board, having a top surface, a bottom surface and a plurality of soldering points, wherein the printed circuit board comprises:
   a first printed circuit, wherein a part of the first printed circuit is on at least one of the top surface and the bottom surface of the printed circuit board, and the part of the first printed circuit is connected with the corresponding soldering point;
   a plurality of light emitting elements, located on the top surface of the printed circuit board and electrically connected to the first printed circuit; and
   a second printed circuit, wherein the second printed circuit does not overlap with the first printed circuit on the top surface; and
   a cover, covering the printed circuit board, wherein the cover has light transmission areas respectively aligned with the light emitting elements, wherein the second printed circuit is configured to provide a capacitance value coupled to a capacitive sensing element coupled between the second printed circuit and the cover.

2. The touch display device of claim 1, wherein the second printed circuit is electrically connected a corresponding one of the soldering points.

3. The touch display device of claim 1, wherein the cover contacts the first printed circuit.

4. The touch display device of claim 1, wherein the cover contacts the second printed circuit.

5. The touch display device of claim 1, wherein the cover contacts the first printed circuit and the second printed circuit.

6. The touch display device of claim 1, wherein the light emitting elements are light emitting diodes.

7. The touch display device of claim 1, wherein the cover has a plurality of accommodating sections, and the light emitting elements are respectively located in the accommodating sections.

8. The touch display device of claim 1, further comprising:
   a plurality of pins, respectively protruding the printed circuit board from a corresponding one of the soldering points.

9. The touch display device of claim 1, wherein the printed circuit board has at least one fixing opening, the cover has at least one fixing member, and the at least one fixing member is coupled to the at least one fixing opening.

10. The touch display device of claim 9, further comprising:
    an adhesive layer, configured at the bottom surface of the printed circuit board to connect the printed circuit board and the cover.

11. The touch display device of claim 1, wherein the printed circuit board further has at least one light sensor located on the top surface of the printed circuit board and aligned with the at least one of the light transmission areas.

12. The touch display device of claim 1, wherein the light transmission areas comprise seven first light transmission areas to form a seven-segment display.

13. The touch display device of claim 12, wherein the printed circuit board further has a light sensor, the light transmission areas of the cover further comprises a second light transmission area, and the second light transmission area are located at a side of the seven light transmission areas and aligned with the light sensor.

14. A touch display module, comprising:
a plurality of the touch display devices of claim 1, wherein the touch display devices are coupled to each other.

\* \* \* \* \*